US006891413B2

United States Patent
Okui

(10) Patent No.: US 6,891,413 B2
(45) Date of Patent: May 10, 2005

(54) PERIODIC SIGNAL CONTROLLER

(75) Inventor: Yoshiaki Okui, Nagano (JP)

(73) Assignee: Sanyo Denki Co., Ltd., Tokyo (JP)

( * ) Notice: Subject to any disclaimer, the term of this patent is extended or adjusted under 35 U.S.C. 154(b) by 0 days.

(21) Appl. No.: 10/629,294

(22) Filed: Jul. 29, 2003

(65) Prior Publication Data

US 2004/0021489 A1 Feb. 5, 2004

(30) Foreign Application Priority Data

Jul. 30, 2002 (JP) ........................................ 2002-221472

(51) Int. Cl.$^7$ .............................................. H03L 7/06
(52) U.S. Cl. ...................................... 327/156; 327/141
(58) Field of Search ................................. 327/156, 141, 327/144–147, 150, 159

(56) References Cited

U.S. PATENT DOCUMENTS

| 4,811,236 A | * | 3/1989 | Brennen et al. ............... 702/64 |
| 6,147,530 A | | 11/2000 | Nogawa |

FOREIGN PATENT DOCUMENTS

| EP | 0 115 326 | | 1/1983 | | |
| EP | 0 479 237 A1 | | 4/1992 | | |
| EP | 0 652 642 A1 | | 5/1995 | | |
| JP | 07283731 | | 10/1995 | | |
| JP | 10056798 A | * | 2/1998 | ............. | H02P/9/00 |
| JP | 10-221386 | | 8/1998 | | |
| JP | 10-323053 | | 12/1998 | | |
| JP | 10323053 | | 12/1998 | | |
| JP | 2004064515 A | * | 2/2004 | ............. | H03L/7/00 |

OTHER PUBLICATIONS

PLL Applied Circuit, 0000042762, (Cited on p. one of the specification).

* cited by examiner

Primary Examiner—Timothy P. Callahan
Assistant Examiner—Cassandra Cox
(74) Attorney, Agent, or Firm—Rankin, Hill, Porter & Clark LLP

(57) ABSTRACT

In a periodic signal controller of the present invention, a first phase difference detection circuit 1 and a first sine-wave signal generation circuit 2 constitute a phase-locked loop for processing instantaneous values. A frequency difference detection circuit 4 determines a frequency difference between AC input and output signals, using instantaneous values of a first sine-wave signal output from the first sine-wave generation circuit 2 and a second sine-wave signal output from a second sine-wave signal generation circuit 9. A second phase difference detection circuit 3 determines a phase difference between the first and second sine-wave signals. An adder circuit 5 adds a phase difference detection signal to a frequency difference detection signal. A frequency variation rate limiter circuit 8 receives an output of the adder circuit 5 to limit a frequency variation rate of the second sine-wave signal to a fixed value or less, and also outputs to the second sine-wave signal generation circuit 9 a command signal for synchronizing the second sine-wave signal to the AC input signal. With this arrangement, even if the AC input signal includes a harmonic voltage, a sine-wave AC output signal synchronized with the AC input signal is generated.

12 Claims, 6 Drawing Sheets

PERIODIC SIGNAL CONTROLLER

BACKGROUND OF THE INVENTION

The present invention relates to a periodic signal controller for generating a periodic AC output signal synchronized with a periodic AC input signal and a frequency detection device suitable for use in the periodic signal controller. More specifically, the invention relates to a periodic signal controller that can synchronize or unsynchronize the AC output signal with the AC input signal at a frequency variation rate not exceeding a fixed frequency variation rate.

For control over inverters in uninterruptible power supply devices or the like, a technique for generating an AC output signal synchronized with an AC input signal is employed. As described in 'PLL (Phase-Locked Loop) Applied Circuit' by Takeshi Yanagisawa, pp. 28–36, for example, the periodic signal controller of a so-called digital phase-locked loop type is known. In this device, the AC input signal is pulsed by a zero-cross comparator, and pulse width comparison is made by a counter, thereby detecting a phase difference between the AC input and output signals and a frequency of the AC output signal. Then, the AC output signal synchronized with the AC input signal is output. In the "PLL Applied Circuit", pp. 5–26 also discloses the periodic signal controller of an analog PLL type. In this device, a phase difference between AC input and output signals is determined from a product of the AC input signal by the AC output signal. Then, the frequency of an AC output voltage is determined from a signal indicating this phase difference, so that the AC output voltage synchronized with the AC input signal is output.

Japanese Patent No. 3235651 discloses the periodic signal controller of the PLL type with its frequency variation rate not exceeding a fixed value. The technique described in the Japanese Patent No. 3235651 constitutes a PLL structure based on the frequency detection device described in Japanese Patent No. 30530002. This PLL structure has following features:

1) The PLL structure is of a two-stage analog PLL structure. In a first-stage PLL, a frequency difference between an AC input signal and a reference frequency is determined. The frequency difference is not between the AC input signal and an AC output signal. This frequency difference is determined from an integral element output under a proportional-integral (PI) control. Since the frequency difference is determined from the integral element output, instantaneous frequency values are not processed.

2) The frequency variation rate is set by inputting a frequency difference detection signal indicating this frequency difference to a second-stage PLL and then passing the signal through a limiter. When the frequency of the AC input signal has varied during synchronization, the signal indicating the frequency difference between the AC input signal and the reference frequency is input to the second-stage PLL, so that the AC output signal follows the AC input signal at the frequency variation rate not exceeding the fixed frequency variation rate.

In the periodic signal controller of the digital PLL type, the zero-cross comparator is employed. Thus, the device is greatly vulnerable to noise near zero cross points. When this periodic signal controller of the digital PLL type is employed for the uninterruptible power supply device, the periodic signal controller often malfunctions in an environment with comparatively poor quality of power. On the other hand, the periodic signal controller of the analog PLL type is comparatively immune to noise or is not readily affected by noise, because the controller uses analog signal values. However, designing the controller to achieve a high gain is difficult. Further, it was difficult to readily set the frequency variation rate.

In the technique using the PLLs, described in the Japanese Patent No. 3235651, the periodic signal controller is comparatively immune to noise and can readily set the frequency variation rate. However, this controller has following problems:

1) Since the frequency difference detection signal is determined from the output under the PI control, it took much time for the periodic signal controller to be brought to a steady state. For this reason, it also took much time until the periodic signal controller became able to start to attain synchronization.

2) If a harmonic voltage was included in the AC input voltage, the controller was sometimes affected by the harmonic voltage.

3) Since an instantaneous frequency difference detection signal indicating an instantaneous input and output frequency difference was not determined, there were some points at which attaining synchronization was difficult.

Further, for detection of frequency anomaly or undesirable frequency variation, when the periodic signal controller of the analog PLL type was employed, an additional frequency anomaly detection circuit had to be provided, in addition to the periodic signal controller. Moreover, in the periodic signal controller of the two-stage analog PLL structure, it takes much time for the controller to be brought into the steady state. In addition, if the harmonic voltage was included in the AC input signal, a result of frequency anomaly detection was sometimes affected.

SUMMARY OF THE INVENTION

The present invention has been therefore made to solve the above-mentioned problems. It is therefore an object of the present invention to provide a periodic signal controller that can generate a sine-wave AC output signal synchronized with an AC input signal even if the AC input signal includes a harmonic voltage.

Another object of the present invention is to provide a periodic signal controller that can synchronize an AC output signal with an AC input signal at high speed, without being affected by noise and harmonics.

Still another object of the present invention is to provide a frequency detection device that can instantaneously detect a frequency of a signal, without being affected by noise and harmonics.

The present invention aims at improvement of a periodic signal controller for generating a periodic AC output signal synchronized with a periodic AC input signal. The periodic signal controller according to the present invention basically includes a first sine-wave signal generation circuit, a first phase difference detection circuit, a second sine-wave signal generation circuit, a second phase difference detection circuit, a frequency difference detection circuit, an adder circuit, and a frequency variation rate limiter circuit. The first sine-wave signal generation circuit outputs a first sine-wave signal with its frequency varied according to a first command signal. The first phase difference detection circuit detects a phase difference between the AC input signal and the first sine-wave signal output from the first sine-wave signal detection circuit and then outputs the first command signal indicating the phase difference. The second sine-wave signal generation circuit outputs a second sine-wave signal as the AC output signal. The frequency of the second sine-wave signal is varied according to a second command signal. The second phase difference detection circuit detects a phase difference between the first sine-wave signal output from the first sine-wave signal generation circuit and the second sine-wave signal output from the second sine-wave signal generation circuit and then outputs a phase difference detection signal indicating the phase difference. The frequency difference detection circuit detects a frequency difference between the first sine-wave signal output from the first sine-wave signal generation circuit and the second sine-wave signal output from the second sine-wave signal generation circuit and then outputs a frequency difference detection signal indicating the frequency difference. The adder circuit adds the phase difference detection signal output from the second phase difference detection circuit to the frequency difference detection signal output from the frequency difference detection circuit. The frequency variation rate limiter circuit receives the output of the adder circuit and outputs to the second sine-wave signal generation circuit the second command signal for limiting a frequency variation rate of the second sine-wave signal to a fixed value or less and synchronizing the second sine-wave signal to the AC input signal. The present invention is characterized in that the first phase difference detection circuit and the first sine-wave signal generation circuit constitute a phase-locked loop. Since this phase-locked loop processes instantaneous values, it can make fast response. Thus, even if the AC input signal includes a harmonic voltage, the phase-locked loop follows the AC input signal, thereby allowing generation of a sine-wave AC output signal synchronized with the AC input signal. The output of the phase-locked loop or the output of the first sine-wave signal generation circuit (first sine-wave signal) constitutes a fundamental component of the AC input signal. Accordingly, if an instantaneous frequency difference between the AC output signal (second sine-wave signal) and the first sine-wave signal that constitutes the fundamental component of the AC input signal is determined by the frequency difference detection circuit, the frequency difference detection signal indicating the instantaneous frequency difference is added to the phase difference detection signal output from the second phase difference detection circuit, and then the second command signal is output from the frequency variation rate limiter circuit based on the signal indicating the sum of the frequency difference detection signal and the phase difference detection signal, synchronization can be attained at high speed, without being affected by noise and harmonics.

When a basic structure of this controller is applied to a periodic signal controller for generating a periodic single-phase AC output signal synchronized with a periodic single-phase AC input signal, the periodic signal controller can be varied as including a first sine-wave and cosine-wave signal generation circuit, the first phase difference detection circuit, a second sine-wave and cosine-wave signal generation circuit, a frequency difference detection circuit, a second phase difference detection circuit, the adder, and the frequency variation rate limiter circuit. The first sine-wave and cosine-wave signal generation circuit outputs a first sine-wave signal and a first cosine-wave signal with their respective frequencies varied according to a first command signal. The first phase difference detection circuit comprises a multiplier for multiplying the AC input signal by the first cosine-wave signal output from the first sine-wave and cosine-wave signal generation circuit and a low-pass filter for removing from the output of the multiplier a frequency component having an angular frequency twice the angular frequency of the single-phase AC input signal. The first phase difference detection circuit detects a phase difference between the single-phase AC input signal and the first sine-wave signal and then outputs the first command signal indicating the phase difference. The second sine-wave and cosine-wave signal generation circuit generates a second sine-wave signal and a second cosine-wave signal with their respective frequencies varied according to a second command signal and outputs the second sine-wave signal as the single-phase AC output signal. The frequency difference detection circuit computes a frequency difference between the AC input signal and the AC output signal from instantaneous values of the first sine-wave and cosine-wave signals output from the first sine-wave and cosine-wave signal generation circuit and the second sine-wave and cosine-wave signals output from the second sine-wave and cosine-wave signal generation circuit, and outputs a frequency difference detection signal indicating the frequency difference. The second phase difference detection circuit receives the instantaneous values of the first sine-wave and cosine-wave signals output from the first sine-wave and cosine-wave signal generation circuit and the second sine-wave and cosine-wave signals output from the second sine-wave and cosine-wave signal generation circuit, computes a phase difference between the first sine-wave signal and the second sine-wave signal, and then outputs a frequency difference detection signal indicating the frequency difference. The adder circuit adds the phase difference detection signal output from the second phase difference detection circuit to the frequency difference detection signal output from the frequency difference detection circuit. The frequency variation rate limiter circuit receives the output of the adder circuit and outputs to the second sine-wave and cosine-wave signal generation circuit the second command signal for limiting the frequency variation rate of the second sine-wave signal to a fixed value or less and synchronizing the second sine-wave signal to the AC input signal. In this case as well, the first phase difference detection circuit and the first sine-wave and cosine-wave signal generation circuit constitute the phase-locked loop.

When the present invention is applied to a periodic signal controller for generating periodic three-phase AC output signals synchronized with periodic three-phase AC input signals, the periodic signal controller includes a three-to-two phase transformation circuit for converting the three-phase AC input signals to two phase signals, a first sine-wave and cosine-wave signal generation circuit, a first phase difference detection circuit, a second sine-wave and cosine-wave signal generation circuit, a frequency difference detection circuit, a second phase difference detection circuit, the adder circuit, and the frequency variation rate limiter circuit. This periodic signal controller is different from the variation of the periodic signal controller described above in that the first phase difference detection circuit uses the output of the three-to-two phase transformation circuit instead of the AC input signal, the second sine-wave and cosine-wave signal generation circuit generates the three-phase AC output signal with its frequency varied according to the second command signal, and the first phase difference detection circuit detects a phase difference between a phase-transformed sine-wave signal and the first sine-wave signal based on the instantaneous values of the first sine-wave and cosine-wave signals output from the first sine-wave and cosine-wave generation circuit and phase-transformed sine-wave and cosine-wave signals output from the three-to-two phase transformation circuit. Structures of other circuits are substantially the same as in the variation of the periodic signal controller as described above.

In either case, preferably the periodic signal controller further includes a frequency anomaly detection circuit for determining whether a frequency of an AC input signal has an anomaly and a switching circuit for preventing the output of the adder circuit from being input to the frequency variation rate limiter circuit and causing the frequency variation rate limiter circuit to output a forcing command signal for forcibly limiting the frequency variation rate of the second sine-wave signal to a fixed value or less when the frequency anomaly detection circuit detects the frequency anomaly. If these circuits are additionally included, when a frequency anomaly in the AC input signal has occurred, synchronization will not be performed. Thus, the periodic signal controller can output an AC output signal, without being affected by the frequency anomaly in the AC input signal.

In this case, the frequency variation rate limiter circuit can be constituted by a limiter for limiting the amount of frequency variation required for synchronization to a predetermined upper value and an integrator for integrating the output of the limiter, thereby outputting a frequency value required for the synchronization. The frequency anomaly detection circuit can include a determination circuit for comparing the sum of the frequency value output from the integrator and a reference frequency for the AC input signal with a predetermined reference value for frequency anomaly detection, and determining a frequency anomaly if the value of the sum exceeds the predetermined reference value for frequency anomaly detection. With this circuit structure, the frequency anomaly in an AC input signal can be readily detected.

The frequency anomaly detection circuit can include an input frequency detection circuit and a determination circuit. The input frequency detection circuit receives the first sine-wave and cosine-wave signals output from the first sine-wave and cosine-wave signal generation circuit, and then computes an input frequency f ($\approx f_s$) based on a formula of $$f_s = \{\sin(\omega_s \cdot t_n) \cdot \cos(\omega_s \cdot t_{n-1}) - \cos(\omega_s \cdot t_n) \cdot \sin((\omega_s \cdot t_{n-1}))/2\pi t_s$$

where $t_n$ indicates an nth sampling time, $t_{n-1}$ indicates an (n-1)th sampling time, an angular frequency $\omega_s$ indicates $2\pi f_s$, in which $f_s$ indicates the frequency of each of the first sine-wave signal and the first cosine-wave signal output from the first sine-wave and cosine-wave signal generation circuit, and $t_s$ indicates a sampling period of time on an assumption that the input signal of the first sine-wave and cosine-wave signal generation circuit is synchronized with the output signal of the first sine-wave and cosine-wave signal generation circuit at high speed. The determination circuit compares the input frequency determined by the input frequency detection circuit with a predetermined reference value for frequency anomaly detection to determine the frequency anomaly when the input frequency exceeds the predetermined reference value for frequency anomaly detection. The input frequency detection circuit and the first sine-wave and cosine-wave signal generation circuit for generating sine-wave and cosine-wave signals synchronized with an AC input signal to be measured can constitute a frequency detection device or circuit. This frequency detection device or circuit can perform instantaneous frequency detection without being affected by noise and harmonics.

The periodic signal controller of the present invention is immune to noise, can stably synchronize an AC output signal with an AC input signal even if the AC input signal includes a harmonic voltage, and can synchronously follows at a frequency variation rate not exceeding a fixed frequency variation rate even if an input frequency has been varied. Further, the periodic signal controller of the present invention can synchronize an AC output signal with an AC input signal from an unsynchronized state at high speed and at a frequency variation rate not exceeding the fixed frequency variation rate. When an AC output signal gets out of synchronization or unsynchronized as well, the frequency of the AC output signal can be adjusted to be a predetermined frequency at a frequency variation rate not exceeding the fixed frequency variation rate. Further, without the need of adding a complex and expensive frequency anomaly detection circuit, an input frequency anomaly can be readily detected at high speed. In addition, a frequency detection device that is comparatively immune to noise and the harmonic voltage can also be obtained.

BRIEF DESCRIPTION OF THE DRAWINGS

These and other objects and further features of the present invention will be apparent from the following detailed description when read in conjunction with the accompanying drawings.

DETAILED DESCRIPTION OF THE PREFERRED EMBODIMENTS

Embodiments of the present invention will be described in detail with reference to the appended drawings.

Figure 1:
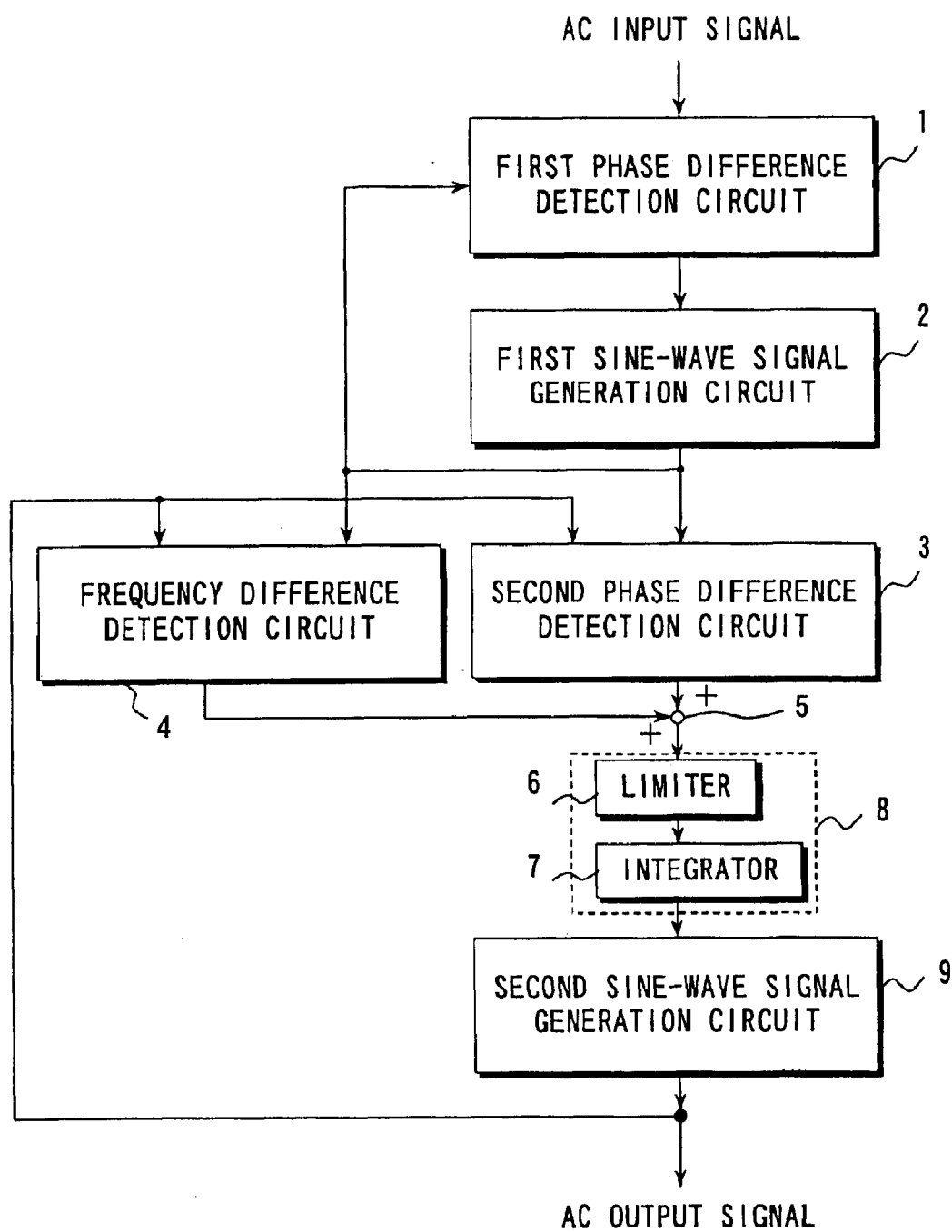
FIG. 1 is a block diagram showing a basic structure of a periodic signal controller according to a first embodiment of the present invention.

FIG. 1 is a block diagram showing a basic structure of a periodic signal controller according to a first embodiment of the present invention. The periodic signal controller includes a first phase difference detection circuit 1, a first sine-wave signal generation circuit 2, a second phase difference detection circuit 3, a frequency difference detection circuit 4, an adder circuit 5, a frequency variation rate limiter circuit 8, and a second sine-wave signal generation circuit 9. The first phase difference detection circuit 1 detects a phase difference between an AC input signal and a first sine-wave signal output from the first sine-wave signal generation circuit 2, and outputs a first command signal indicating the phase difference. The first sine-wave signal generation circuit 2 outputs the first sine-wave signal with its frequency varied according to the first command signal. As will be described later in detail, the first phase difference detection circuit 1 and the first sine-wave signal generation circuit 2 constitute a PLL (phase-locked loop) that processes instantaneous values.

The second sine-wave signal generation circuit 9 outputs a second sine-wave signal with its frequency varied according to a second command signal that will be described later. The second phase difference detection circuit 3 detects a phase difference between the first sine-wave signal output from the first sine-wave signal generation circuit 2 and the second sine-wave signal output from the second sine-wave signal generation circuit 9, and outputs a phase difference detection signal indicating the phase difference. The frequency difference detection circuit 4 detects a frequency difference between the first sine-wave signal output from the first sine-wave signal generation circuit 2 and the second sine-wave signal output from the second sine-wave signal generation circuit 9, and outputs a frequency difference detection signal indicating the frequency difference. The adder circuit 5 adds the phase difference detection signal output from the second phase-difference detection circuit 3 to the frequency difference detection signal output from the frequency difference detection circuit 4. The frequency variation rate limiter circuit 8 is constituted by a limiter 6 and an integrator 7, which will be described later. The frequency variation rate limiter circuit 8 receives an output of the adder circuit 5 and outputs the second command signal to the second sine-wave signal generation circuit 9. The second command signal serves to limit a frequency variation rate of the second sine-wave signal or AC output signal to a fixed value or less and synchronize the second sine-wave signal or AC output signal with the AC input signal.

The periodic signal controller in this embodiment is comparatively immune to noise, and can readily set the frequency variation rate. An operation of the periodic signal controller in this embodiment will be described. First, the phase difference between the AC input signal and the first sine-wave signal output from the first sine-wave signal generation circuit 2, indicated by the first command signal, is determined by the first phase difference detection circuit 1. Then, the output of the first phase difference detection circuit 1 or first command signal is input to the first sine-wave signal generation circuit 2. In the first sine-wave signal generation circuit 2, the frequency of the first sine-wave signal to be output is varied according to the first command signal, and the first sine-wave signal is output so that the phase difference from the AC input signal is eliminated. The sine-wave signal synchronized with the AC input signal is thereby obtained. There is no upper limit of the frequency variation rate to the frequency of the first sine-wave signal generated from the first sine-wave signal generation circuit 2. Thus, by increasing a frequency variable range, synchronization with the AC input signal is attained at high speed. While being synchronized with the AC input signal, the frequency of the first sine-wave signal obtained from the first sine-wave signal generation circuit 2 is the same as the frequency of the AC input signal, but the amplitude of the first sine-wave signal is independent of the AC input signal. The phase difference between the first sine-wave signal output from the first sine-wave signal generation circuit 2 and the second sine-wave signal output from the second sine-wave signal generation circuit 9 is determined by the second phase difference detection circuit 3. The frequency difference between the first sine-wave signal output from the first sine-wave signal generation circuit 2 and the second sine-wave signal output from the second sine-wave signal generation circuit 9 is determined by the frequency difference detection circuit 4. If the amplitude of the first sine-wave signal output from the first sine-wave signal generation circuit 2 and the amplitude of the second sine-wave signal output from the second sine-wave signal generation circuit 9 are the same, the frequency difference can be detected with high accuracy, which will be described later. For this reason, in this embodiment, instead of directly using the AC input signal with its amplitude varied, an output signal of the first sine-wave signal generation circuit 2 or the first sine-wave signal synchronized with the AC input signal with a constant amplitude is employed. If the amplitude of the AC input signal is constant, the AC input signal may be input to the second phase difference detection circuit 3, without using the output of the first sine-wave signal generation circuit 2.

The output of the second phase difference detection circuit 3 is added to the output of the frequency difference detection circuit 4 by the adder circuit 5, and is input to the second sine-wave signal generation circuit 9 via the limiter 6 and the integrator 7. A frequency variation of the second sine-wave signal output from the second sine-wave signal generation circuit 9 or AC output signal is limited by the limiter 6. An input to the limiter 6 indicates an amount of frequency variation or the frequency variation rate required for synchronization of the AC output signal with the AC input signal. The correlation among a phase, the frequency, and the frequency variation rate of an AC signal is similar to that among a position, a rate, and an acceleration of the signal. The frequency variation rate is obtained by frequency differentiation. In other words, an upper limit is imposed on the amount of frequency variation or the frequency variation rate by the limiter 6, and the amount of frequency variation on which the upper limit has been imposed is converted to a frequency value required for synchronization, indicated by the second command signal, by the integrator 7.

Figure 2:
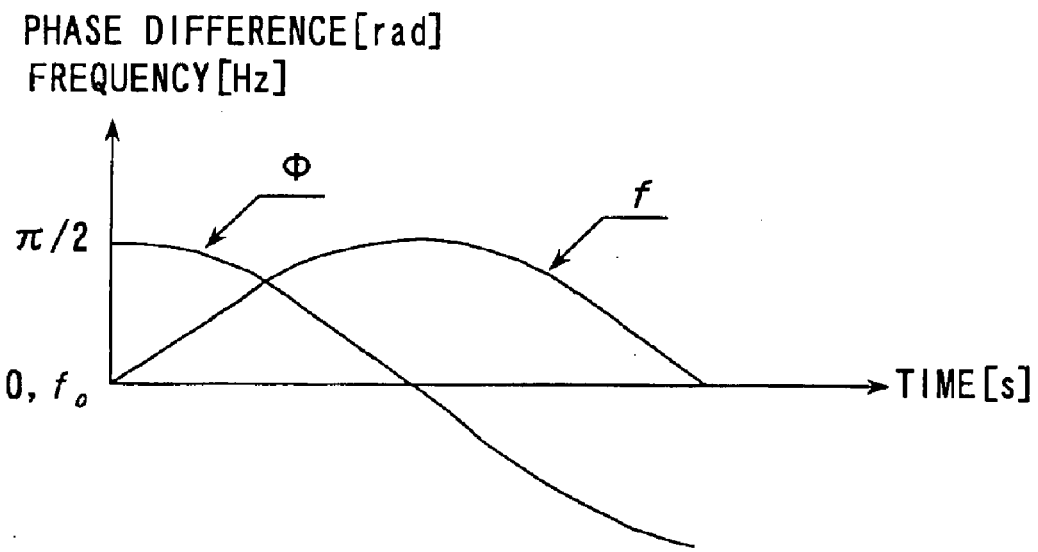
FIG. 2 is a graph showing the relationship among a phase difference, a frequency, and time when synchronization is to be attained by using a phase difference detection signal alone, without using a frequency difference detection signal.
Figure 3:
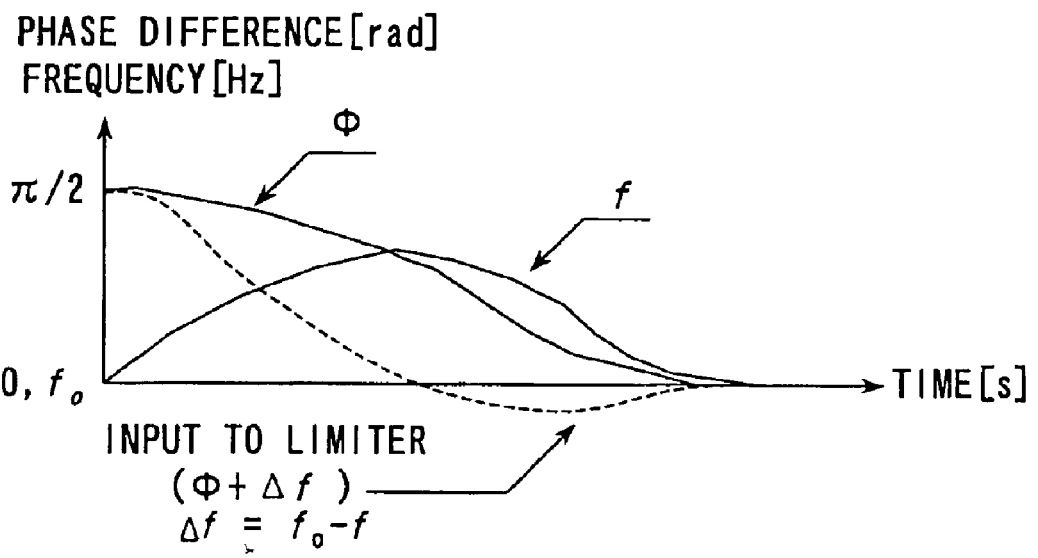
FIG. 3 is a graph employed for description about an operation of the periodic signal controller in FIG. 1, showing the relationship among the frequency, phase difference, and time.

The second sine-wave signal is output from the second sine-wave signal generation circuit 9 according to the frequency value supplied from the integrator 7. Now, assume a case where only the phase difference detection signal output from the second phase difference detection circuit 3 is input to the second sine-wave signal generation circuit 9 via the limiter 6 and the integrator 7, thereby outputting the second sine-wave signal. FIG. 2 shows the relationship among a phase difference $\phi$, a frequency f, and time when synchronization is to be attained using the phase difference detection signal alone, without using the frequency difference detection signal. More specifically, FIG. 2 shows the case where synchronization is to be attained from a state in which the input signal is equal to the output signal, with their phase difference $\phi$ being $\pi/2$, and their frequency f being f0. In this case, the relationship between the phase difference and an output frequency is as shown in FIG. 2, due to the existence of the integrator 7. When the phase difference $\phi$ has become zero, the frequency f increases to a maximum, so that synchronization becomes difficult to attain. Next, assume a case where the integrator 7 disposed to an output side of the limiter 6 is not employed, though a sum of the phase difference detection signal and the frequency difference detection signal is input to the limiter 6. In this case, when the frequency of the AC input signal has become equal to or larger than a value obtained by adding a reference frequency to an upper limit value of the amount of frequency variation defined by the limiter 6, synchronization becomes impossible. For this reason, the integrator 7 becomes essential. In other words, if a relation of output frequency$\leq$reference frequency+limiter value<input frequency holds, synchronization cannot be performed. More specifically, when synchronization is to be attained using the integrator 7, the relationship among the phase difference, frequency, and time needs to be as shown in FIG. 3. The relationship between the frequency variation rate and the frequency should be the relationship of differentiation or integration. In order to obtain a variation of the frequency f in FIG. 3, the frequency variation rate must be changed, as shown by a dotted curve in FIG. 3, which indicates differentiated values of the frequency. This dotted locus can be obtained from addition of the phase difference φ to a frequency difference Δf. For this reason, the sum of the phase difference detection signal indicating the phase difference φ and the frequency difference detection signal indicating the frequency difference Δf done by the adder circuit 5 is input to the limiter 6 shown in FIG. 1.

Figure 4:
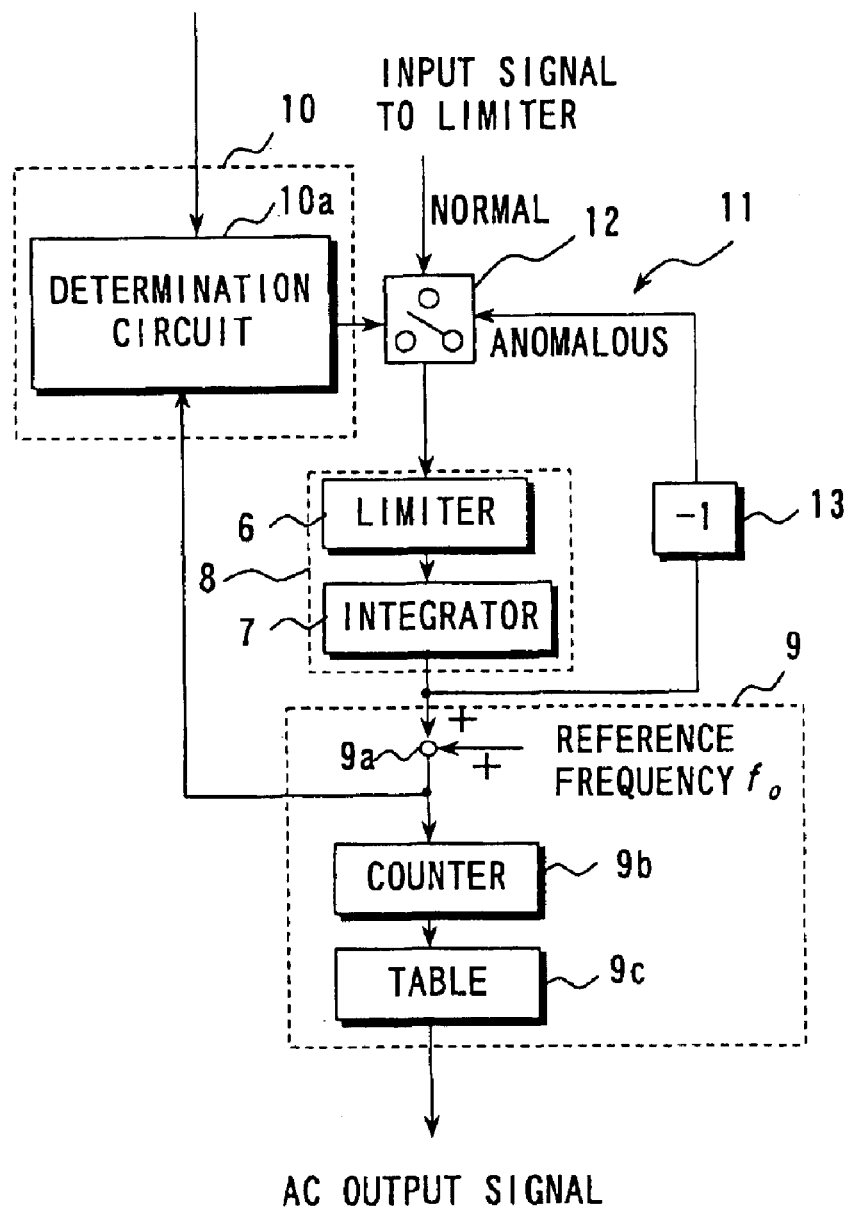
FIG. 4 is a block diagram showing an example of a frequency anomaly detection circuit.

If the periodic signal controller is constructed as shown in FIG. 1, synchronization can be attained. However, if a frequency anomaly has occurred in the AC input signal, the AC output signal cannot get out of synchronization or be unsynchronized. In order to unsynchronize the AC output signal, addition of a circuit as shown in FIG. 4 is necessary. The circuit shown in FIG. 4 includes a frequency anomaly detection circuit 10 for determining whether or not the frequency of the AC input signal has an anomaly and a switching circuit 11. The switching circuit 11 prevents the output of the adder circuit 5 from being input to the frequency variation rate limiter circuit 8 and causes the frequency variation rate limiter circuit 8 to output a forcing command signal as the second command signal for gradually matching the frequency of the second sine-wave signal to the predetermined reference frequency f0. The frequency anomaly detection circuit 10 in this embodiment includes a determination circuit 10a. The determination circuit 10a compares the sum of the frequency value output from the integrator 7 and the reference frequency f0 for the AC input signal with a predetermined reference value for frequency anomaly detection, thereby determining that the frequency anomaly has occurred when the sum exceeds the predetermined reference value for frequency anomaly detection. The second sine-wave signal generation circuit 9 includes an adder 9a for adding the frequency value output from the integrator 7 to the reference frequency f0 for the AC input signal, a counter 9b for receiving the sum output from the adder 9a to perform counting, and a table 9c that stores sine-wave signal amplitude values associated with addresses output from the counter 9b. The table 9c outputs stored amplitude values one by one according to a count from the counter 9b, thereby outputting the sine-wave signal. If the AC input signal is a three-phase AC signal, the table 9c stores amplitude values of a cosine-wave signal and AC signals of three phases. In this case, one of the AC signals of the three phases becomes the sine-wave signal. The switching circuit 11 in this embodiment is constituted by a signal switching circuit 12 and a feedback loop 13 having a "−1" gain.

The switching circuit 11 outputs the forcing command signal as the second command signal for gradually matching a current output frequency fx (fx=Δfx+f0) to the reference frequency f0 at the frequency variation rate not exceeding the predetermined frequency variation rate. The sum of the output of the integrator 7 and the reference frequency f0 indicates the output frequency of the second sine-wave signal generation circuit 9, which can be considered to be the same as the frequency of the AC input signal, if synchronization is confirmed. Accordingly, if the frequency value of the signal input to the second sine-wave signal generation circuit 9 has become a value deviated from the value set in the determination circuit 10a of the frequency anomaly detection circuit 10, the determination circuit 10a determines that a frequency anomaly has occurred in the input signal. Thus, a switch of the signal switching circuit 12 is switched from a "normal position" to an "anomalous position" according to a signal from the determination circuit 10a. After the switching has been performed, the frequency of the AC output signal therefore becomes close to the reference frequency f0. If this circuit is provided and a frequency anomaly has occurred in the AC input signal, synchronization will not be performed. Thus, the AC output signal can be output without being affected by the frequency anomaly of the AC input signal.

Figure 5:
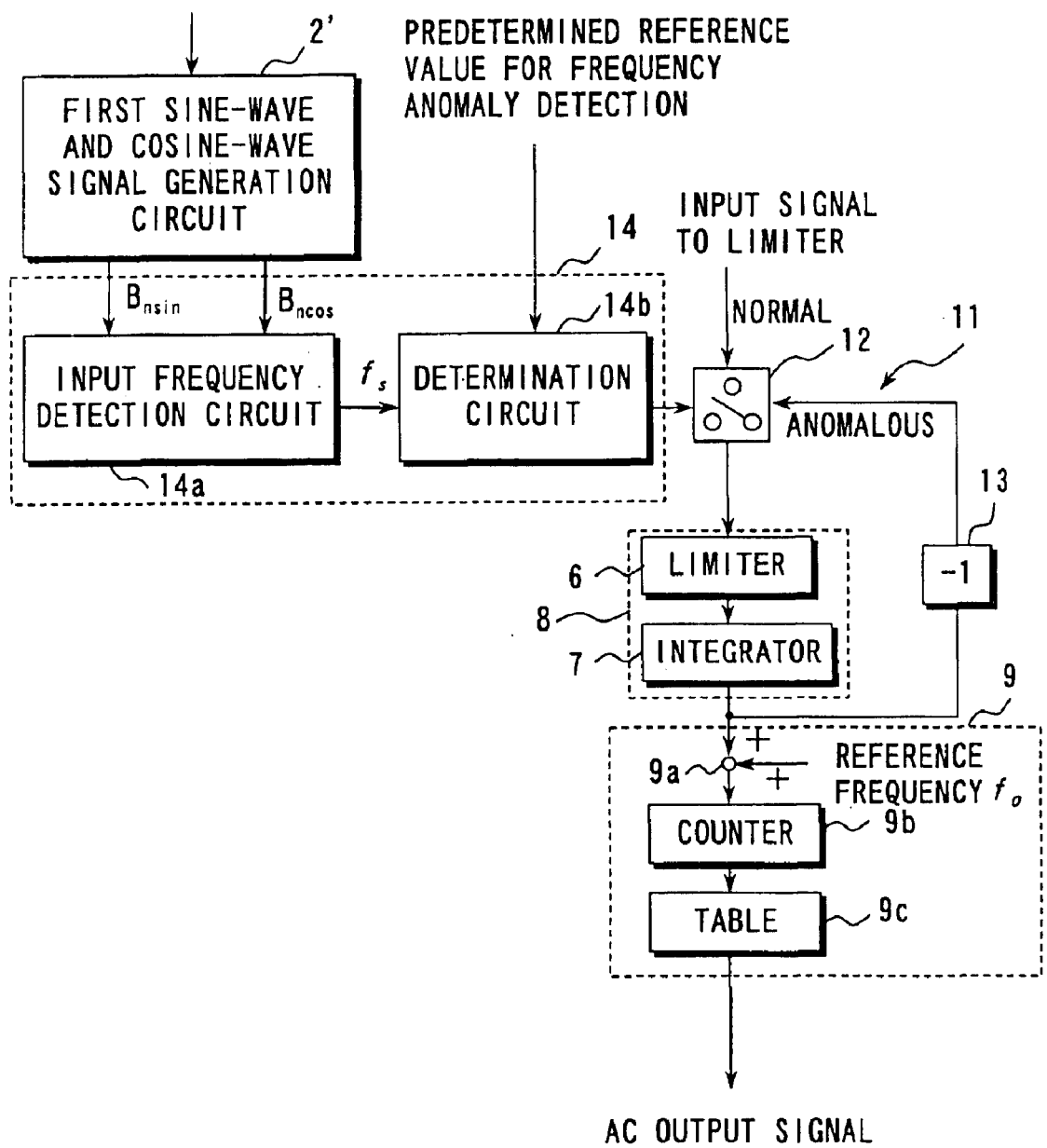
FIG. 5 is a block diagram showing another example of the frequency anomaly detection circuit.

FIG. 5 shows a frequency anomaly detection circuit 14, which is another example of the circuit for detecting a frequency anomaly. The frequency anomaly detection circuit 14 in this example includes an input frequency detection circuit 14a. The input frequency detection circuit 14a receives the first sine-wave signal and a first cosine-wave signal output from the first sine-wave and cosine-wave signal generation circuit 2' fabricated by modifying the first sine-wave signal generation circuit 2 so as to allow output of sine-wave and cosine-wave signals. The input frequency detection circuit input frequency detection circuit 14a detects an input frequency f (≈f$_s$) using Formula (1) given below:

$$f \approx f_s = (\omega_s \cdot t_s)/2\pi t_s \qquad (1)$$
$$= \omega_s(t_n - t_{n-1})/2\pi t_s$$
$$\cong \sin(\omega_s(t_n - t_{n-1}))/2\pi t_s$$
$$= \{\sin(\omega_s t_n) \cdot \cos(\omega_s t_{n-1}) - \cos(\omega_s t_n) \cdot \sin(\omega_s t_{n-1})\}/2\pi t_s$$
$$= (B_{n\sin}B_{n-1\cos} - B_{n\cos}B_{n-1\sin})/2\pi t_s$$

The sine-wave signal [$B_{nsin}=\sin(\omega_s t)$] and the cosine-wave signal [$B_{ncos}=\cos(\omega_s t)$] are output from the first sine-wave and cosine-wave signal generation circuit 2'. In this formula, n indicates an nth sampled value, while n-1 indicates an (n-1)th sampled value. $t_n$ indicates an nth sampling time, while $t_{n-1}$ indicates an (n-1)th sampling time. An angular frequency $\omega_s$ indicates $2\pi f_s$, in which $f_s$ indicates the frequency of each of the first sine-wave signal and the first cosine-wave signal output from the first sine-wave and cosine-wave signal generation circuit 2'. $t_s$ indicates a sampling period. It is assumed that the input signal to the first sine-wave and cosine-wave signal generation circuit is synchronized with the output signal of the first sine-wave and cosine-wave signal generation circuit at high speed, and the input frequency f is substantially the same as $f_s$. The above Formula (1) shows that the input frequency f (≈$f_s$) can be computed from the sampled values of the signals output from the first sine-wave and cosine-wave signal generation circuit 2'. In the frequency anomaly detection circuit in FIG. 5, the input frequency $f_s$ determined from the above Formula (1) is compared with a predetermined reference value for frequency detection by the determination circuit 14b. If the input frequency $f_s$ deviates from the predetermined reference value for frequency anomaly detection, it is determined that a frequency anomaly has occurred. Then, the switch of the signal switching circuit 12 is switched from the normal position to the anomalous position according to the output of the determination circuit 14b, which is the same as in the frequency anomaly detection circuit 10 in FIG. 4, described before. The predetermined reference value for frequency anomaly detection can be set to the value of the reference frequency f0 (50 Hz or 60 Hz) ±5%, for example. The predetermined reference value for frequency anomaly detection, however, can be set arbitrarily. The frequency detection device as shown in FIG. 5 can instantaneously detect the frequency of a signal without being affected by noise and harmonics.

Figure 6:
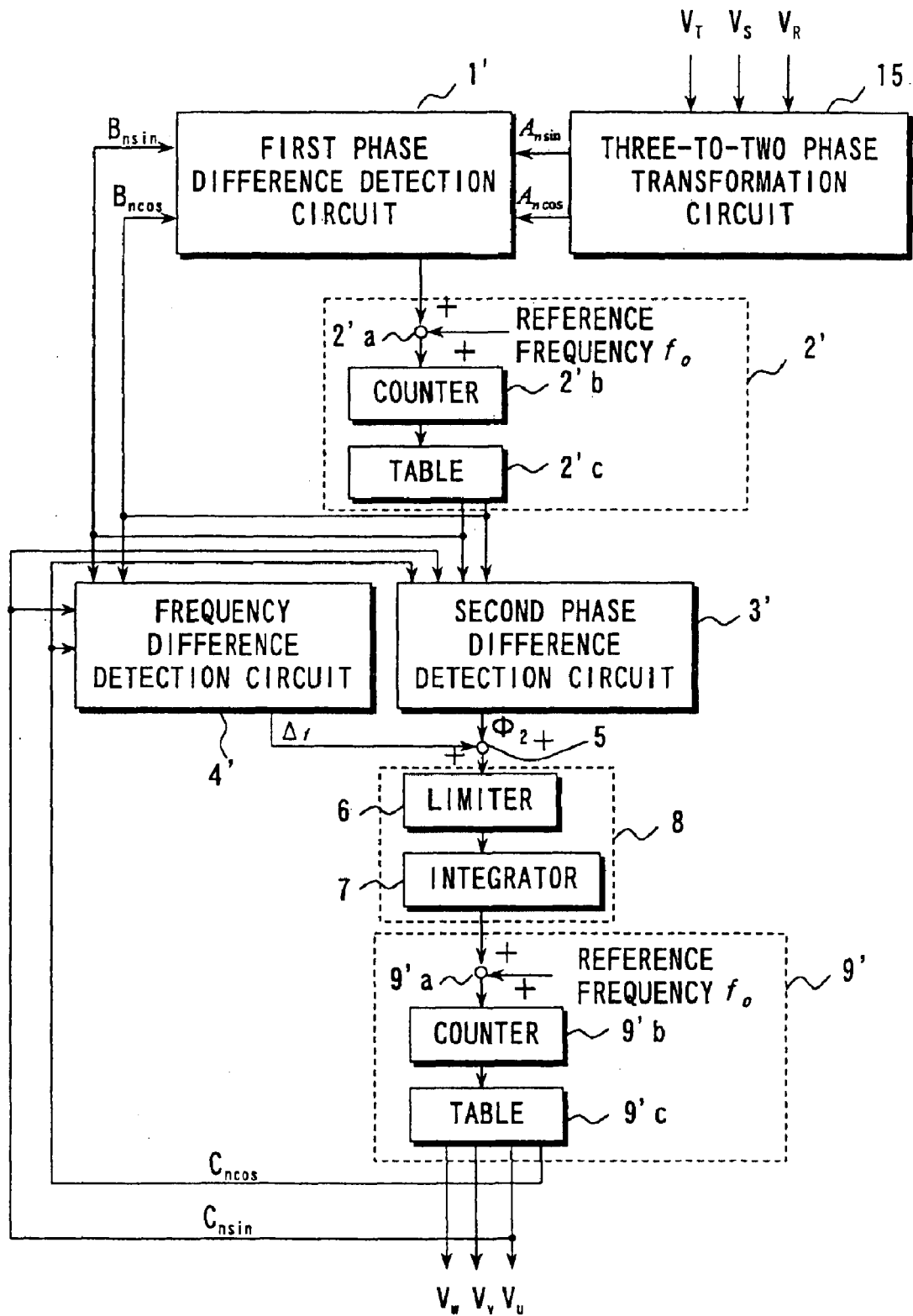
FIG. 6 is a block diagram showing a structure of a periodic signal controller according to a second embodiment of the present invention.

Next, a periodic signal controller according to a second embodiment of the present invention will be described with reference to FIG. 6. In FIG. 6, same reference alphanumeric characters are assigned to blocks that perform the same function as the blocks employed in the first embodiment shown in FIG. 1, and their descriptions will be omitted. To the blocks that perform a similar function to the blocks employed in the first embodiment, same reference alphanumeric characters each with an apostrophe are assigned. An AC input signal in this embodiment shown in FIG. 6 is of three phases. The periodic signal controller in this embodiment includes a three-to-two phase transformation circuit 15 for converting three-phase AC input signals to two-phase signals, a first phase difference detection circuit 1', a first sine-wave and cosine-wave signal generation circuit 2', a second phase difference detection 3', a frequency difference detection circuit 4', the adder circuit 5, the frequency variation rate limiter circuit 8, and a second sine-wave and cosine-wave signal generation circuit 9'.

First, the three-to-two phase transformation circuit 15 performs three-to-phase transformation on the three-phase AC input signals based on Formula (2) given below:

$$\begin{bmatrix} A_{ncos} \\ A_{nsin} \end{bmatrix} = \sqrt{\frac{2}{3}} \begin{bmatrix} 1 & -1/2 & -1/2 \\ 0 & \sqrt{3}/2 & -\sqrt{3}/2 \end{bmatrix} \begin{bmatrix} v_R \\ v_S \\ v_T \end{bmatrix} \quad (2)$$

$$= \begin{bmatrix} A_1 \sin(\omega t) \\ A_2 \sin(\omega t - \pi/2) \end{bmatrix} = \begin{bmatrix} A_1 \cos(\omega t + \phi) \\ A_2 \sin(\omega t + \phi) \end{bmatrix}$$

$$v_R = \sqrt{2} \, V_R \sin(\omega t)$$
$$v_S = \sqrt{2} \, V_S \sin(\omega t - 2\pi/3)$$
$$v_T = \sqrt{2} \, V_T \sin(\omega t - 4\pi/3)$$

where $v_R$, $v_S$, and $v_T$ are three phase AC input signals, and $V_R$ indicates an effective value of an R phase voltage, $V_S$ indicates an effective value of an S phase voltage, and $V_T$ indicates an effective value of a T phase voltage.

A first sine-wave signal $[B_{nsin}=\sin(\omega_s t)]$ and a first cosine-wave signal $[B_{ncos}=\cos(\omega_s t)]$ are output from the first sine-wave and cosine-wave signal generation circuit 2'. As in Formula (1), the angular frequency $\omega_s$ of each of these signals is $2\pi f_s$, in which $f_s$ is the frequency of each of the first sine-wave signal and the first cosine-wave signal output from the first sine-wave and cosine-wave signal generation circuit 2'. A phase difference between the signal output from the first sine-wave and cosine-wave signal generation circuit and the signal that has been subject to the three-to-two phase transformation is $\phi$. Considering the signals output from the first sine-wave and cosine-wave signal generation circuit 2' as reference signals, Formula (3) given below holds for the three-to-two phase transformed signals and the signals output from the first sine-wave and cosine-wave signal generation circuit 2'.

$$A\sin((\omega - \omega_s)t + \phi) = A_2\sin(\omega t + \phi) \cdot \cos(\omega_s t) - \quad (3)$$
$$A_1\cos(\omega t + \phi) \cdot \sin(\omega_s t)$$
$$= A_{nsin}B_{ncos} - A_{ncos}B_{nsin}$$

If amplitudes $A_1$ and $A_2$ are substantially equal to A, and the angular frequency $\omega$ of the AC input signal is substantially equal to the angular frequency $\omega_s$ of each of the outputs of the first sine-wave and cosine-wave signal generation circuit 2', Formula (3) can be approximated to Formula (4) given below when the phase difference $\phi$ is close to zero.

$$\phi \cong (A_{n\,sin}B_{n\,cos} - A_{n\,cos}B_{n\,sin})/A \quad (4)$$

The above Formula (4), shows the phase difference between the AC input signal and the signal output from the first sine-wave and cosine-wave signal generation circuit 2', namely, shows the output of the first phase difference detection circuit 1'. Formula (4) shows that the phase difference can be determined from instantaneous values of the AC input signals and the output signals of the first sine-wave and cosine-wave signal generation circuit 2'. If the amplitudes, $A_1$ and $A_2$ are different, or three phases are in an unbalanced state, an amplitude component having a difference between $A_1$ and $A_2$ with a frequency component of twice the angular frequency $\omega$ will appear in the phase difference $\phi$. In this case, this phase difference $\phi$ may be used so that it does not affect synchronization or may be used after the frequency component of twice the angular frequency $\omega$ has been removed by a low-pass filter.

The first sine-wave and cosine-wave signal generation circuit 2' outputs the first sine-wave signal and the first cosine-wave signal according to the phase difference detection signal indicating the phase difference $\phi$ as the first command signal. In the first sine-wave and cosine-wave signal generation circuit 2', the phase difference detection signal indicating the phase difference $\phi$ is added to the signal indicating the reference frequency f0 by an adder 2'a to determine an instantaneous frequency signal. Sine and cosine waves can be output from the instantaneous frequency signal, by using a voltage controlled oscillator (VCO), for example. This processing can also be performed digitally, as shown in FIG. 6. In this embodiment, sine-wave data and cosine-wave data are stored in a table 2'c in the form of table values, and the table 2'c outputs the sine-wave and cosine-wave signals by referring to the output of a counter 2'b. The instantaneous frequency signal output from the adder 2'a is input to the counter 2'b, so that the counter 2'b performs counting up. This counting operation constitutes integration that integrates the instantaneous frequency signal into a value indicating the phase of the instantaneous frequency signal. Then, the table 2'c refers to the table values indicated by the phase value, thereby outputting the sine-wave and cosine-wave signals.

Next, a phase difference $\phi 2$ between the first sine-wave signal $B_{nsin}$ output from the first sine-wave and cosine-wave signal generation circuit 2' and a second sine-wave signal $[C_{nsin}=\sin(\omega_0 t)]$ output from the second sine-wave and cosine-wave signal generation circuit 9' or the phase difference $\phi 2$ between the first cosine-wave signal $B_{ncos}$ and a second cosine-wave signal $[C_{ncos}=\cos(\omega_0 t)]$ is determined by the second phase difference detection circuit 3'. In the second phase difference detection circuit 3', the phase difference $\phi 2$ is determined in a same manner as in a case where the above Formula (3) and Formula (4) were employed. Since the amplitudes of the signals output from the first sine-wave and cosine-wave signal generation circuit 2' and the second sine-wave and cosine-wave signal generation circuit 9' are one, the phase difference $\phi 2$ is obtained from Formula (5) given below:

$$\phi_2 \cong D_{n\,sin} = \sin((\omega_s - \omega_o)t + \phi_2) = B_{n\,sin}C_{n\,cos} - B_{n\,cos}C_{n\,sin} \quad (5)$$

A following Formula (6) can also be derived from the output signals of the first sine-wave and cosine-wave signal generation circuit 2' and the second sine-wave and cosine-wave signal generation circuit 9':

$$D_{n\,cos}=\cos((\omega_s-\omega_o)t+\phi_2)=B_{n\,cos}C_{n\,cos}+B_{n\,sin}C_{n\,sin} \qquad (6)$$

where if n in $D_{nsin}$ indicates the nth sampled value and n-1 indicates the (n-1)th sampled value, the following Formula (7) can be derived from Formula (5) and Formula (6):

$$\begin{aligned}\Delta\omega\cdot t_s &\cong \sin(\Delta\omega(t_n-t_{n-1})) \\ &= \sin(\Delta\omega t_n + \phi_2)\cdot\cos(\Delta\omega t_{n-1}+\phi_2) - \\ &\quad \cos(\Delta\omega t_n+\phi_2)\cdot\sin(\Delta\omega t_{n-1}+\phi_2) \\ &= D_{n\sin}D_{n-1\cos} - D_{n\cos}D_{n-1\sin}\end{aligned} \qquad (7)$$

In the above Formula (7), $\Delta\omega$ indicates the frequency difference ($=\omega_s-\omega_o$), while $t_s$ indicates the sampling period of time. Formula (7) shows that the frequency difference $\Delta\omega$ ($=2\pi\Delta f$) can be determined from the instantaneous values of the signals output from the first sine-wave and cosine-wave signal generation circuit 2' and the second sine-wave and cosine-wave signal generation circuit 9'.

In the periodic signal controller in the second embodiment shown in FIG. 6, the second phase difference detection circuit 3' computes the phase difference $\phi 2$ according to Formula (5), and the frequency difference detection circuit 4' computes the frequency difference $\Delta f$ ($=\Delta\omega/2\pi$) according to Formula (7). The phase difference detection signal indicating the phase difference $\phi 2$ is added to the frequency difference detection signal indicating the frequency difference $\Delta f$ by the adder circuit 5 and input to the integrator 7 via the limiter 6. As in the first embodiment, the limiter 6 limits the frequency variation rate of the second sine-wave signal or the AC output signal. The sum of the output of the integrator 7 and the reference frequency f0 indicates the instantaneous frequency of each of the signals output from the second sine-wave and cosine-wave signal generation circuit 9'. As in the first sine-wave and cosine-wave signal generation circuit 2', the second sine-wave and cosine-wave signal generation circuit 9' is constituted by an adder 9'a, a counter 9'b, and a table 9'c. A second cosine-wave and three-phase AC signals of $V_u$, $V_v$, and $V_w$ are output from the table 9'c according to the signal from the counter 9'b. The AC signal Vu serves as a second sine-wave.

If voltage variation of and voltage unbalance in AC input voltages are not present, the outputs obtained from the three-to-two phase transformation shown in the above Formula (2) may be input to the second phase difference detection circuit 3' and the frequency difference detection circuit 4', thereby outputting the signals synchronized with the AC input signals.

Figure 7:
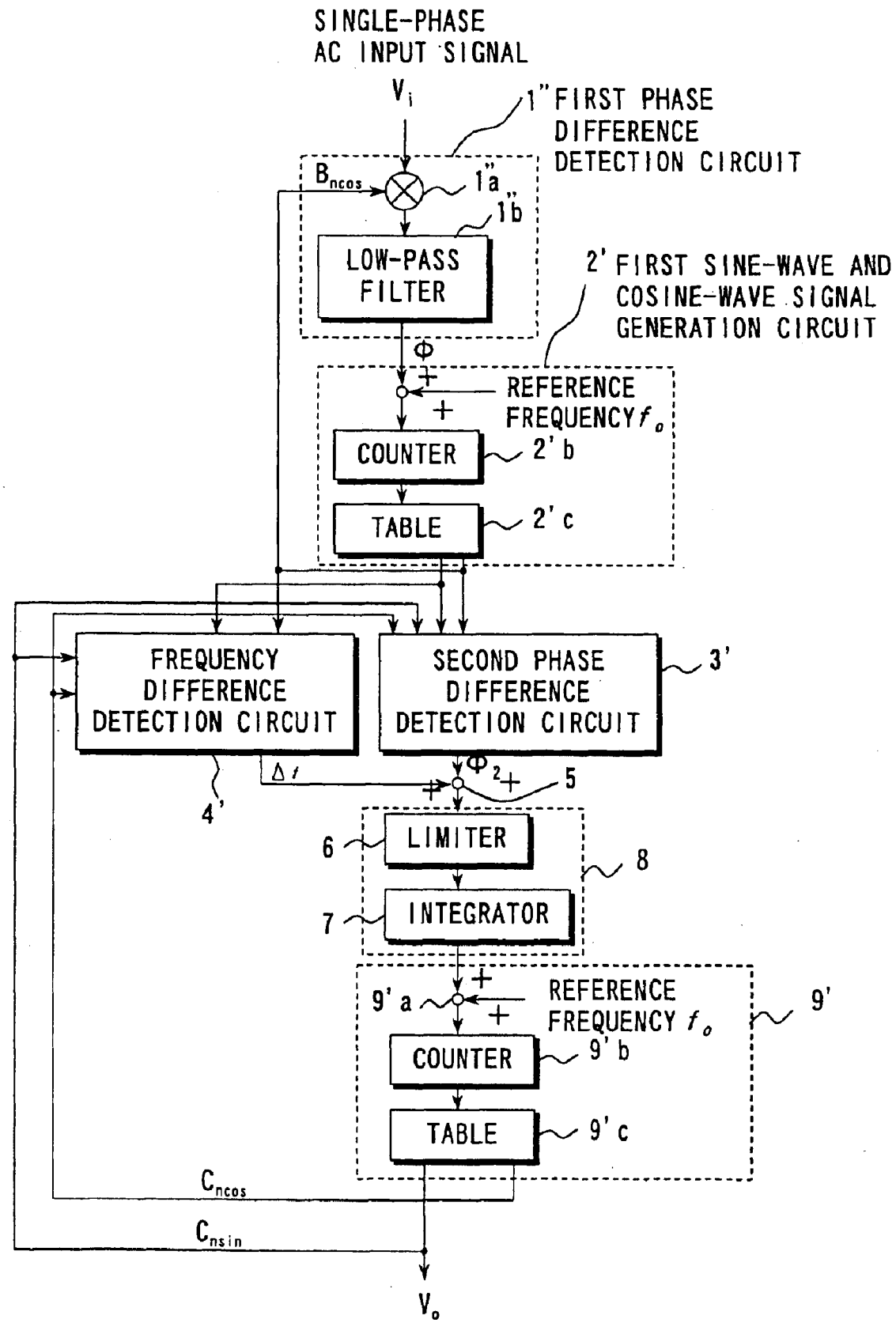
FIG. 7 is a block diagram showing a structure of a periodic signal controller according to a third embodiment of the present invention.

FIG. 7 is a block diagram showing a structure of a periodic signal controller according to a third embodiment of the present invention. In this embodiment, the AC input signal is of a single phase. In this embodiment, the first phase difference detection circuit 1' and the three-to-two phase transformation circuit 15 shown in FIG. 6 are replaced with the first phase difference detection circuit 1". The periodic signal controller in the third embodiment includes the first sine-wave and cosine-wave signal generation circuit 2', first phase difference detection circuit 1", second sine-wave and cosine-wave signal generation circuit 9', frequency difference detection circuit 4', second phase difference detection circuit 3', adder circuit 5, and frequency variation rate limiter circuit 8. The first sine-wave and cosine-wave signal generation circuit 2' outputs the first sine-wave signal and the first cosine-wave signal with their respective frequencies varied according to the first command signal. The first phase difference detection circuit 1" includes a multiplier 1"a for multiplying the AC input signal by the first cosine-wave signal $B_{ncos}$ output from the first sine-wave and cosine-wave signal generation circuit 2', and a low-pass filter 1"b for removing the frequency component having twice the angular frequency of the AC input signal from the output of the multiplier 1"a. The first phase difference detection circuit 1 detects the phase difference $\phi$ between the AC input signal and the first sine-wave signal, and outputs the first command signal indicating the phase difference. The second sine-wave and cosine-wave signal generation circuit 9' generates the second sine-wave signal and the second cosine-wave signal with their respective frequencies varied according to the second command signal, and outputs the second sine-wave signal as a single-phase AC input signal. The frequency difference detection circuit 4' computes the frequency difference between the AC input signal and the AC output signal according to the above Formula (7) using instantaneous values of the first sine-wave signal and the first cosine-wave signal output from the first sine-wave and cosine-wave signal generation circuit 2' and the second sine-wave signal and the second cosine-wave signal output from the second sine-wave and cosine-wave signal generation circuit 9'. The second phase difference detection circuit 3' determines the phase difference between the first sine-wave signal output from the first sine-wave and cosine-wave signal generation circuit 2' and the second sine-wave signal, based on the above Formula (5). The circuits disposed on the output side from the adder circuit 5 are constructed substantially the same as the circuits in the second embodiment. Namely, the frequency variation rate limiter circuit 8 receives the phase difference detection signal output from the second phase difference detection circuit 3' and the frequency difference detection signal output from the frequency difference detection circuit 4' to limit the frequency variation rate of the second sine-wave signal to a fixed value or less, and also outputs to the second sine-wave and cosine-wave signal generation circuit 9' the second command signal for synchronizing the second sine-wave signal to the AC input signal. The first phase difference detection circuit 1 and the first sine-wave and cosine-wave signal generation circuit 2' constitute the phase-locked loop for processing instantaneous values.

In this embodiment, multiplication of the AC input signal by the first cosine wave signal output from the first sine-wave and cosine-wave signal generation circuit 2' is expressed by Formula (8) given below:

$$\begin{aligned}A_{n\sin}B_{n\cos} &= A\sin(\omega t + \phi)\cdot\cos(\omega_s t) \\ &= \frac{A}{2}\{\sin((\omega-\omega_s)t+\phi) + \sin((\omega+\omega_s)t+\phi)\} \\ &\cong \frac{A}{2}\{\sin(\phi) + \sin((\omega+\omega_s)t+\phi)\}\end{aligned} \qquad (8)$$

The value of multiplication of the AC input signal by the cosine-wave signal from the first sine-wave and cosine-wave signal generation circuit 2' is passed through the low-pass filter 1"b, thereby removing the frequency component having twice the angular frequency $\omega$. Then, Formula (8) is rewritten as Formula (9) given as follows:

$$\phi \cong \sin(\phi) \qquad (9)$$

-continued $$\cong \{\sin(\phi) + \sin((\omega + \omega_s)t + \phi)\}$$

$$\cong (A_{nsin} B_{ncos}) \times 2 / A$$

By using the low-pass filter, terms of $\sin((\omega+\omega_s)t+\phi)$ in Formulas (8) and (9) are eliminated. When the phase difference $\phi$ is close to zero, $\phi \approx \sin(\phi)$ holds. Thus, as shown in Formula (9), $\phi \approx (A_{nsin} B_{ncos}) \times 2/A$ holds.

The output of the low-pass filter 1b indicates the phase difference $\phi$, and is input to the first sine-wave and cosine-wave signal generation circuit 2' as the first command signal. Operations of other circuits are as described above.

Needless to say, the frequency anomaly detection circuit shown in FIG. 4 or 5 can be combined with the periodic signal controller in the second or third embodiment shown in FIGS. 6 and 7.

Further, the present invention is not limited to these embodiments, but various variations and modifications may be made without departing from the scope of the present invention.

What is claimed is:

1. A periodic signal controller for generating a periodic AC output signal synchronized with a periodic AC input signal, comprising:

a first sine-wave signal generation circuit for outputting a first sine-wave signal with a frequency varied according to a first command signal;

a first phase difference detection circuit for detecting a phase difference between the AC input signal and the first sine-wave signal output from said first sine-wave signal detection circuit and then outputting the first command signal indicating the phase difference;

a second sine-wave signal generation circuit for outputting a second sine-wave signal as the AC output signal, the second sine-wave signal having a frequency varied according to a second command signal;

a second phase difference detection circuit for detecting a phase difference between the first sine-wave signal output from said first sine-wave signal generation circuit and the second sine-wave signal output from said second sine-wave signal generation circuit and then outputting a phase difference detection signal indicating the phase difference;

a frequency difference detection circuit for detecting a frequency difference between the first sine-wave signal output from said first sine-wave signal generation circuit and the second sine-wave signal output from said second sine-wave signal generation circuit and then outputting a frequency difference detection signal indicating the frequency difference;

an adder circuit for adding the phase difference detection signal output from said second phase difference detection circuit to the frequency difference detection signal output from said frequency difference detection circuit; and a frequency variation rate limiter circuit for receiving an output of said adder circuit and outputting to said second sine-wave signal generation circuit the second command signal for limiting a frequency variation rate of the second sine-wave signal to a fixed value or less and synchronizing the second sine-wave signal with the AC input signal;

wherein said first phase difference detection circuit and said first sine-wave signal generation circuit constitute a phase-locked loop.

2. The periodic signal controller as claimed in claim 1, further comprising:

a frequency anomaly detection circuit for determining whether the AC input signal has a frequency anomaly or not; and a switching circuit for preventing the output of said adder circuit from being input to said frequency variation rate limiter circuit and causing said frequency variation rate limiter circuit to output as the second command signal a forcing command signal for gradually matching a frequency of the second sine-wave signal to a predetermined reference frequency when said frequency anomaly detection circuit detects the frequency anomaly.

3. The periodic signal controller as claimed in claim 2, wherein said frequency variation rate limiter circuit comprises:

a limiter for limiting an amount of frequency variation required for synchronization of the AC output signal to the AC input signal to a predetermined upper value; and an integrator for integrating an output of said limiter, thereby outputting a frequency value required for the synchronization; and said frequency anomaly detection circuit comprises a determination circuit for determining the frequency anomaly when a sum of the frequency value output from said integrator and the reference frequency for the AC input signal exceeds a predetermined reference value for frequency anomaly detection.

4. A periodic signal controller for generating a periodic single-phase AC output signal synchronized with a periodic single-phase AC input signal, comprising:

a first sine-wave and cosine-wave signal generation circuit for outputting a first sine-wave signal and a first cosine-wave signal with respective frequencies thereof varied according to a first command signal;

a first phase difference detection circuit for detecting a phase difference between the single-phase AC input signal and the first sine-wave signal and then outputting the first command signal indicating the phase difference, said first phase difference detection circuit comprising a multiplier for multiplying the AC input signal by the first cosine-wave signal output from said first sine-wave and cosine-wave signal generation circuit and a low-pass filter for removing from an output of said multiplier a frequency component having an angular frequency twice the angular frequency of the single-phase AC input signal;

a second sine-wave and cosine-wave signal generation circuit for generating a second sine-wave signal and a second cosine-wave signal with respective frequencies thereof varied according to a second command signal and outputting the second sine-wave signal as the single-phase AC output signal;

a frequency difference detection circuit for computing a frequency difference between the AC input signal and the AC output signal from instantaneous values of the first sine-wave and cosine-wave signals output from said first sine-wave and cosine-wave signal generation circuit and the second sine-wave and cosine-wave signals output from said second sine-wave and cosipe-wave signal generation circuit and then outputting a frequency difference detection signal indicating the frequency difference;

a second phase difference detection circuit for receiving the instantaneous values of the first sine-wave and cosine-wave signals output from said first sine-wave and cosine-wave signal generation circuit and the second sine-wave and cosine-wave signals output from said second sine-wave and cosine-wave signal generation circuit, computing a phase difference between the first sine-wave signal and the second sine-wave signal, and then outputting a phase difference detection signal indicating the phase difference;

an adder circuit for adding the phase difference detection signal output from said second phase difference detection circuit to the frequency difference detection signal output from said frequency difference detection circuit; and a frequency variation rate limiter circuit for receiving an output of said adder circuit and outputting to said second sine-wave and cosine-wave signal generation circuit the second command signal for limiting a frequency variation rate of the second sine-wave signal to a fixed value or less and synchronizing the second sine-wave signal with the AC input signal;

wherein said first phase difference detection circuit and said first sine-wave and cosine-wave signal generation circuit constitute a phase-locked loop.

5. The periodic signal controller as claimed in claim 4, further comprising:

a frequency anomaly detection circuit for determining whether the AC input signal has a frequency anomaly or not; and a switching circuit for preventing the output of said adder circuit from being input to said frequency variation rate limiter circuit and causing said frequency variation rate limiter circuit to output as the second command signal a forcing command signal for gradually matching a frequency of the second sine-wave signal to a predetermined reference frequency when said frequency anomaly detection circuit detects the frequency anomaly.

6. The periodic signal controller as claimed in claim 5, wherein said frequency variation rate limiter circuit comprises:

a limiter for limiting an amount of frequency variation required for synchronization of the AC output signal to the AC input signal to a predetermined upper value; and an integrator for integrating an output of said limiter, thereby outputting a frequency value required for the synchronization; and said frequency anomaly detection circuit comprises a determination circuit for determining the frequency anomaly when a sum of the frequency value output from said integrator and the reference frequency for the AC input signal exceeds a predetermined reference value for frequency anomaly detection.

7. The periodic signal controller as claimed in claim 5, wherein said frequency anomaly detection circuit comprises:

an input frequency detection circuit for receiving the first sine-wave and cosine-wave signals output from said first sine-wave and cosine-wave signal generation circuit, and then computing an input frequency f ($\approx f_s$) based on a formula $$f_s = \{\sin(\omega_s \cdot t_n) \cdot \cos(\omega_s \cdot t_{n-1}) - \cos(\omega_s \cdot t_n) \cdot \sin((\omega_s \cdot t_{n-1}))\}/2\pi t_s$$

in which $t_n$ indicates an nth sampling time, $t_{n-1}$ indicates an (n-1)th sampling time, an angular frequency $\omega_s$ indicates $2\pi f_s$, in which $f_s$ indicates a frequency of each of the first sine-wave signal and the first cosine-wave signal output from said first sine-wave and cosine-wave signal generation circuit, $t_s$ indicates a sampling period of time, and an input signal of said first sine-wave and cosine-wave signal generation circuit is synchronized with an output signal of said first sine-wave and cosine-wave signal generation circuit at high speed; and a determination circuit for comparing the input frequency determined by said input frequency detection circuit with a predetermined reference value for frequency anomaly detection to determine the frequency anomaly when the input frequency exceeds the predetermined reference value for frequency anomaly detection.

8. A periodic signal controller for generating a periodic three-phase AC output signal synchronized with a periodic three-phase AC input signal, comprising:

a three-to-two phase transformation circuit for converting the three-phase AC input signals to two phase signals and then outputting a phase-transformed sine-wave signal and a phase-transformed cosine-wave signal;

a first sine-wave and cosine-wave signal generation circuit for outputting a first sine-wave signal and a first cosine-wave signal with respective frequencies thereof varied according to a first command signal;

a first phase difference detection circuit for detecting a phase difference between the ohase-transformed sine-wave signal and the first sine-wave signal based on instantaneous values of the first sine-wave and cosine-wave signals output from said first sine-wave and cosine-wave signal generation circuit and the phase-transformed sine-wave signal and the phase-transformed cosine-wave signal output from said three-to-two phase transformation circuit and then outputting a first phase difference detection signal indicating the phase difference as the first command signal;

a second sine-wave and cosine-wave signal generation circuit for generating a second sine-wave signal and a second cosine-wave signal with respective frequencies thereof varied according to a second command signal and generating the three-phase AC output signal with a frequency thereof varied according to the second command signal, the three-phase AC output signal including the second sine-wave signal;

a frequency difference detection circuit for computing a frequency difference between the AC input signal and the AC output signal using instantaneous values of the first sine-wave and cosine-wave signals output from said first sine-wave and cosine-wave signal generation circuit and the second sine-wave and cosine-wave signals output from said second sine-wave and cosine-wave signal generation circuit, and then outputting a frequency difference detection signal indicating the frequency difference;

a second phase difference detection circuit for receiving the instantaneous values of the first sine-wave and cosine-wave signals output from said first sine-wave and cosine-wave signal generation circuit and the second sine-wave and cosine-wave signals output from said second sine-wave and cosine-wave signal generation circuit, computing a phase difference between the first sine-wave signal and the second sine-wave signal, and then outputting a phase difference detection signal indicating the phase difference;

an adder circuit for adding the phase difference detection signal output from said second phase difference detection circuit to the frequency difference detection signal output from said frequency difference detection circuit; and a frequency variation rate limiter circuit for receiving an output of said adder circuit and then outputting to said second sine-wave and cosine-Wave signal generation circuit the second command signal for limiting a frequency variation rate of the second sine-wave signal to a fixed value or less and synchronizing the second sine-wave signal to the AC input signal;

wherein said first phase difference detection circuit and said first sine-wave and cosine-wave signal generation circuit constitute a phase-locked loop.

9. The periodic signal controller as claimed in claim 8, further comprising:

a frequency anomaly detection circuit for determining whether the AC input signals have a frequency anomaly or not; and a switching circuit for preventing the output of said adder circuit from being input to said frequency variation rate limiter circuit and causing said frequency variation rate limiter circuit to output as the second command signal a forcing command signal for gradually matching a frequency of the second sine-wave signal to a predetermined reference frequency when said frequency anomaly detection circuit detects the frequency anomaly.

10. The periodic signal controller as claimed in claim 9, wherein said frequency variation rate limiter circuit comprises:

a limiter for limiting an amount of frequency variation required for synchronization of the AC output signal to the AC input signal to a predetermined upper value; and an integrator for integrating an output of said limiter, thereby outputting a frequency value required for the synchronization; and said frequency anomaly detection circuit comprises a determination circuit for determining the frequency anomaly when a sum of the frequency value output from said integrator and the reference frequency for the AC input signals exceed a predetermined reference value for frequency anomaly detection.

11. The periodic signal controller as claimed in claim 9, wherein said frequency anomaly detection circuit comprises:

an input frequency detection circuit for receiving the first sine-wave and cosine-wave signals output from said first sine-wave and cosine-wave signal generation circuit, and then computing an input frequency f ($\approx f_s$) based on a formula $$f_s = \{\sin(\omega_s \cdot t_n) \cdot \cos(\omega_s \cdot t_{n-1}) - \cos(\omega_s \cdot t_n) \cdot \sin((\omega_s \cdot t_{n-1})\} / 2\pi t_s$$

in which $t_n$ indicates an nth sampling time, $t_{n-1}$ indicates an (n-1)th sampling time, an angular frequency $\omega_s$ indicates $2\pi f_s$ in which $f_5$ indicates a frequency of each of the first sine-wave signal and the first cosine-wave signal output from said first sine-wave and cosine-wave signal generation circuit, $t_s$ indicates a sampling period of time, and an input signal of said first sine-wave and cosine-wave signal generation circuit is synchronized with an output signal of said first sine-wave and cosine-wave signal generation circuit at high speed; and a determination circuit for comparing the input frequency determined by said input frequency detection circuit with a predetermined reference value for frequency anomaly detection to determine the frequency anomaly when the input frequency exceeds the predetermined reference value for frequency anomaly detection.

12. A frequency detection device comprising:

a sine-wave and cosine-wave signal generation circuit for generating a sine-wave wave signal and a cosine-wave signal synchronized with an AC input signal to be measured; and an input frequency detection circuit for receiving the sine-wave and cosine-wave signals and then computing an input frequency f ($\approx f_s$) based on a formula $$f_s = \{\sin(\omega_s \cdot t_n) \cdot \cos(\omega_s \cdot t_{n-1}) - \cos(\omega_s \cdot t_n) \cdot \sin((\omega_s \cdot t_{n-1})\} / 2\pi t^s$$

in which tn indicates an nth sampling time, $t_{n-1}$ indicates an (n-1) th sampling time, an angular frequency $w_s$ indicates $2\pi f_s$, in which $f_s$ indicates a frequency of each of the sine-wave signal and the first cosine-wave signal output from said first sine-wave and cosine-wave signal generation circuit, $t_s$ indicates a sampling period of time, and an input signal of said sine-wave and cosine-wave signal generation circuit is synchronized with an output signal of said sine-wave and cosine-wave signal generation circuit at high speed.

* * * * *

UNITED STATES PATENT AND TRADEMARK OFFICE
CERTIFICATE OF CORRECTION

PATENT NO. : 6,891,413 B2
DATED : May 10, 2005
INVENTOR(S) : Okui

It is certified that error appears in the above-identified patent and that said Letters Patent is hereby corrected as shown below:

Column 16,
Line 62, delete "cosipe" insert -- cosine --.

Column 18,
Line 25, delete "ohase" and insert -- phase --.

Column 19,
Line 3, delete "Wave" and insert -- wave --.

Column 20,
Line 36, delete "$w_s$" and insert -- $\omega_s$ --.

Signed and Sealed this

Ninth Day of August, 2005

JON W. DUDAS
*Director of the United States Patent and Trademark Office*